United States Patent [19]
Honda et al.

[11] Patent Number: 6,131,073
[45] Date of Patent: Oct. 10, 2000

[54] ELECTRONIC CIRCUIT WITH AN OPERATING CHARACTERISTIC CORRECTING FUNCTION

[75] Inventors: Yoshimitsu Honda, Toyohashi; Hideaki Ishihara, Okazaki; Haruyasu Sakishita, Toyohashi; Kouichi Maeda, Anjo, all of Japan

[73] Assignee: DENSO Corporation, Kawasaki, Japan

[21] Appl. No.: 08/870,732

[22] Filed: Jun. 6, 1997

[30] Foreign Application Priority Data

Jun. 7, 1996 [JP] Japan ................................. 8-146187

[51] Int. Cl.[7] .................................................. G01R 1/44
[52] U.S. Cl. ........................................ 702/107; 330/272
[58] Field of Search ................................. 702/132, 107, 702/104; 361/130; 330/272

[56] References Cited

U.S. PATENT DOCUMENTS

| | | | |
|---|---|---|---|
| 5,365,768 | 11/1994 | Suzuki et al. ............................. | 73/1 R |
| 5,479,096 | 12/1995 | Szczyrbak et al. ..................... | 324/132 |
| 5,659,884 | 8/1997 | Daughtry, Jr. et al. ................ | 455/67.1 |
| 5,705,957 | 1/1998 | Oka et al. ................................. | 331/66 |
| 5,719,782 | 2/1998 | Mitsuoka ................................. | 364/484 |
| 5,731,742 | 3/1998 | Wojewoda et al. ....................... | 331/44 |
| 5,760,656 | 6/1998 | Sutliff et al. ........................ | 331/116 R |
| 5,764,541 | 6/1998 | Hermann et al. .................. | 364/571.01 |
| 5,774,062 | 6/1998 | Ikefuji ................................ | 340/825.54 |
| 5,777,524 | 7/1998 | Wojewoda et al. ................. | 331/116 R |
| 5,801,594 | 9/1998 | Muto et al. ............................. | 331/158 |
| 5,848,355 | 12/1998 | Rasor ...................................... | 455/260 |
| 5,848,383 | 12/1998 | Yunus ..................................... | 702/104 |
| 5,875,388 | 2/1999 | Daughtry, Jr. et al. ................ | 455/67.1 |
| 5,892,408 | 4/1999 | Binder ...................................... | 331/44 |
| 5,897,608 | 4/1999 | Yokoyama et al. ..................... | 702/107 |

FOREIGN PATENT DOCUMENTS

| | | |
|---|---|---|
| 54-126484 | 10/1979 | Japan . |
| 3-152425 | 6/1991 | Japan . |
| 4-318698 | 11/1992 | Japan . |
| 6-281477 | 10/1994 | Japan . |

*Primary Examiner*—Patrick Assouad
*Attorney, Agent, or Firm*—Pillsbury Madison Sutro LLP

[57] ABSTRACT

A power voltage of a power source circuit is produced by amplifying a threshold voltage difference of an operational amplifier by an amplification factor corresponding to a dividing ratio of a resistance dividing circuit. The power source circuit is integrated on a CMOS substrate together with a computer block. A plurality of analog switches are associated with the resistance dividing circuit to stabilize the power voltage of the power source circuit. One of these switches is selectively closed to change the dividing ratio of the resistance dividing circuit in accordance with actuation data stored in a control register.

14 Claims, 7 Drawing Sheets

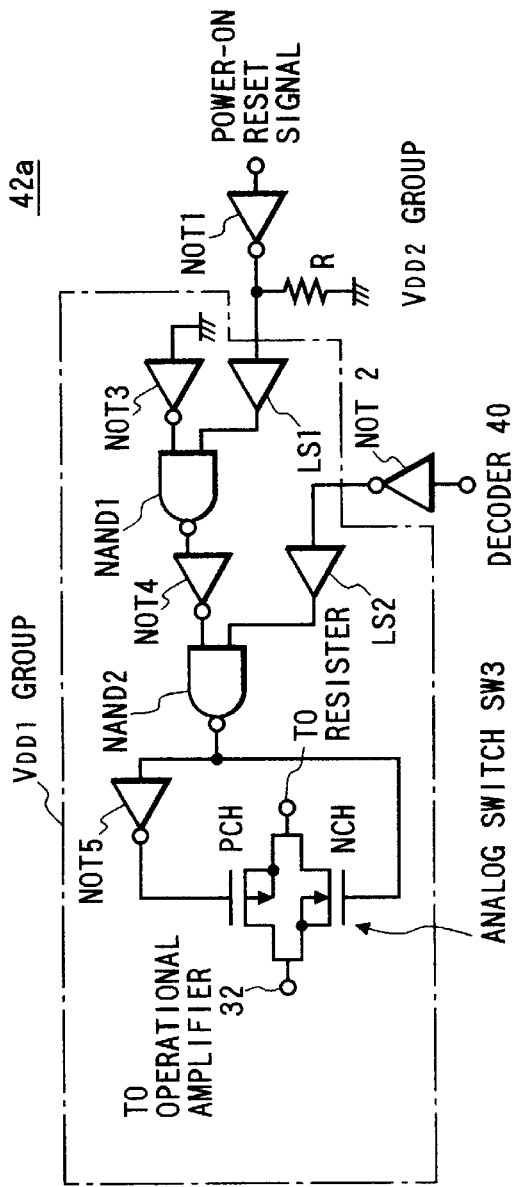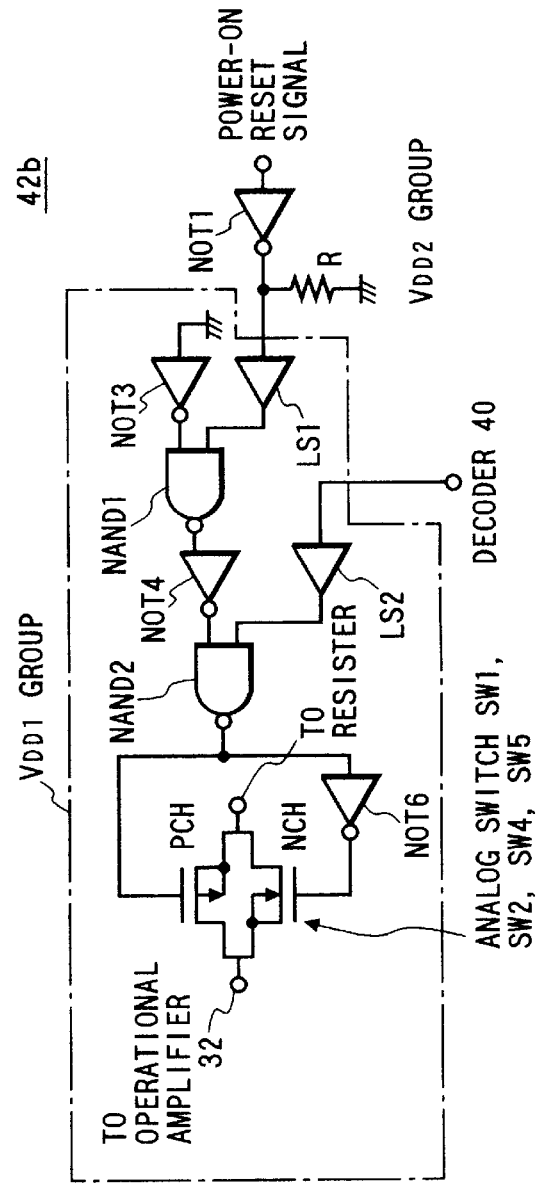
FIG. 3A
FIG. 3B

TEMPERATURE SENSOR 12

EQUIVALENT CIRCUIT

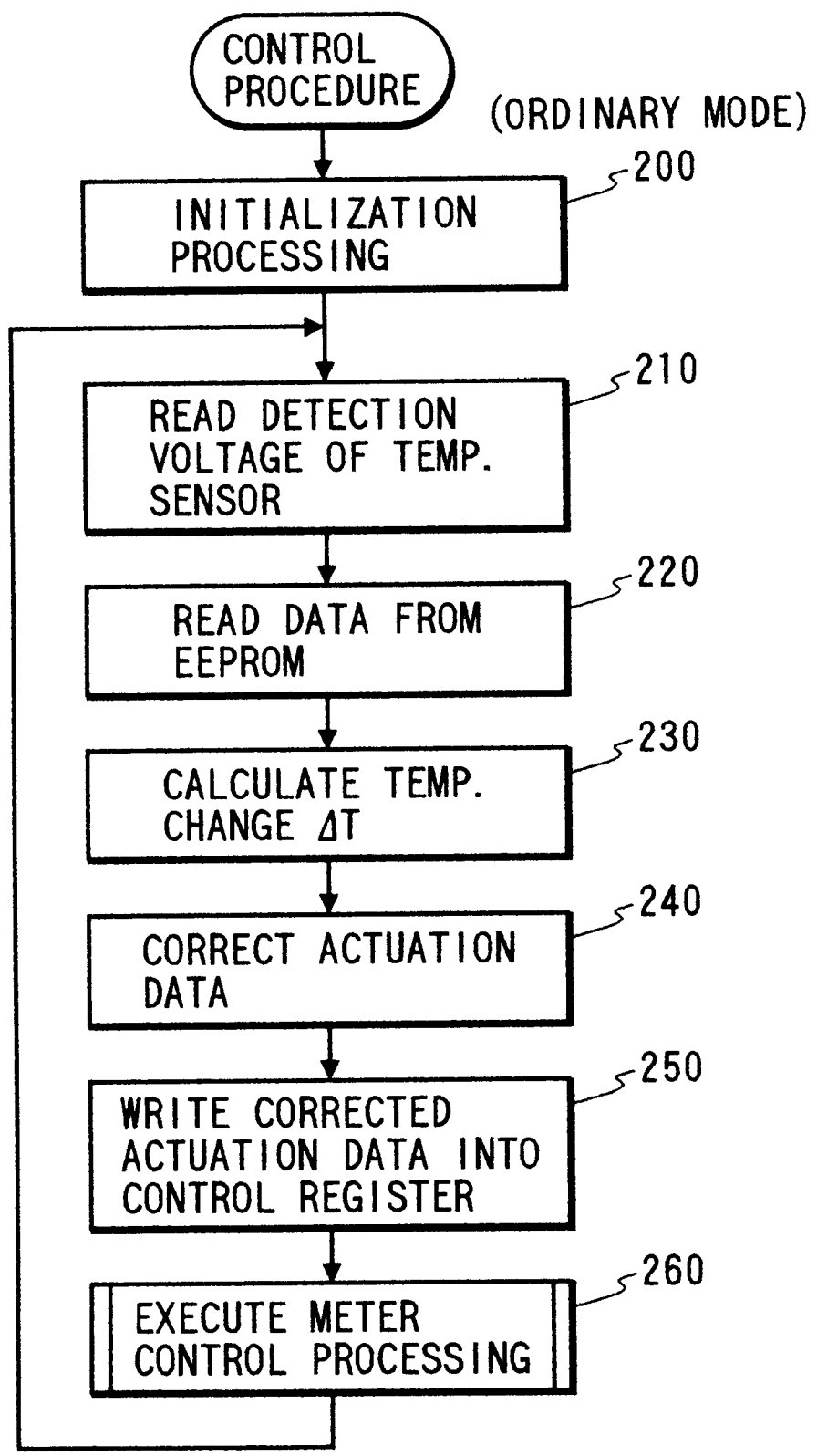

ELECTRONIC CIRCUIT WITH AN OPERATING CHARACTERISTIC CORRECTING FUNCTION

BACKGROUND OF THE INVENTION

1. Field of the Invention

The invention relates to an operating characteristic correcting apparatus capable of stabilizing an operation of an electronic circuit without being adversely influenced by a dispersion of each circuit element due to manufacturing errors etc.

2. Related Art

Conventionally known electronic circuits, such as an amplification circuit amplifying an input signal by a predetermined amplification factor or a constant-voltage circuit converting an input voltage into a predetermined voltage, are generally subjected to undesirable variation in operating characteristics (or performance) due to the dispersion of circuit elements.

According to the prior art, to correct such a dispersion, a predetermined inspection process is provided to check any defect in the operating characteristics of each electronic circuit after the electronic circuit is manufactured. If the operating performance is not satisfactory, the operating parameters of the electronic circuit are modified by adjusting the circuit constant of an adjusting circuit element, such as a variable resistor, provided in the electronic circuit.

However, recent electronic circuits are integrated into a single chip of an IC circuit to facilitate downsizing for shipment. However, executing the above-described adjustment on such an integrated circuit is extremely troublesome.

For example, a power source circuit supplying electric power to an electronic device, such as a microcomputer, may be constituted by an integrated circuit. According to a conventional method, to prevent a deviation of a power voltage produced by this power source circuit, an output voltage of the power source circuit is checked before a manufactured IC substrate incorporating the power source circuit is molded by a resin into a chip component. More specifically, the characteristics of circuit elements of the power source circuit, such as resistors, are adjusted by a laser trimming or fuse trimming method. However, this adjustment is very complicated. Furthermore, if the adjustment fails this chip component becomes defective, thus reducing the overall yield of products.

Furthermore, this kind of electronic circuit is sensitively influenced by the temperature characteristics of circuit elements. Thus, there is a tendency that the operating characteristics will be worsened in accordance with a change in an operating temperature.

SUMMARY OF THE INVENTION

In view of the above-described problems, an object of the present invention is to provide an operating characteristic correcting apparatus for an electronic circuit which is capable of easily adjusting the operating characteristics of the electronic circuit incorporated in an integrated circuit.

In order to accomplish this and other related objects, the present invention provides an operating characteristic correcting apparatus for correcting operating parameters of an electronic circuit. According to the present invention, an adjusting circuit is provided to adjust operating parameters of the electronic circuit incorporated in an integrated circuit. A memory means memorizes actuation data of the adjusting circuit, which are determined beforehand for controlling the operating parameters of the electronic circuit. And, a control means reads the actuation data from the memory means and actuates the adjusting circuit in accordance with the actuation data to control the operating parameters of the electronic circuit.

More specifically, in a preferred mode of the present invention, the electronic circuit is a constant-voltage circuit comprising an operational amplifier utilizing a threshold voltage difference, a resistance dividing circuit, and a voltage-applying switching element applying a direct-current power voltage between both ends of the resistance dividing circuit. The operational amplifier controls the voltage-applying switching element to equalize an electrical potential of a dividing point of the resistance dividing circuit with the threshold voltage difference, so that the direct-current power voltage applied between the both ends of the resistance dividing circuit is equalized with an amplified voltage obtained by amplifying the threshold voltage difference of the operational amplifier by an amplification factor corresponding to a dividing ratio of the resistance dividing circuit. The adjusting circuit comprises a plurality of adjusting switches selectively closed to change the dividing point of the resistance dividing circuit to determine the amplification factor of the constant-voltage circuit. And, the control means selectively closes one of the adjusting switches in accordance with the actuation data to determine the dividing ratio of the resistance dividing circuit, thereby producing a controlled direct-current constant voltage from the constant-voltage circuit.

Preferably, the integrated circuit incorporating the constant-voltage circuit has a terminal for outputting the direct-current constant voltage and a terminal for actuating the adjusting circuit.

It is further preferable to comprise a temperature sensor detecting a temperature of the electronic circuit. The actuation data are corrected based on the temperature detected by the temperature sensor and the adjusting circuit is actuated based on the corrected actuation data, so as to eliminate undesirable temperature drift in the operating parameters of the electronic circuit.

In this case, the temperature sensor may comprise a series circuit consisting of a plurality of MOS-type field effect transistors each having a gate and a drain directly connected. A voltage applied between both ends of the series circuit, that is equivalent to a sum of threshold voltages of the plurality of MOS-type field effect transistors, is outputted from the temperature sensor as a detection signal representing the temperature of the electronic circuit.

Preferably, the memory means stores temperature data sensed by the temperature sensor at a time the actuation data are set, in addition to the actuation data. And, the control means corrects the actuation data based on the temperature data memorized in the memory means and a present temperature sensed by the temperature sensor.

Still further, it is preferable to comprise an operating mode switching means for switching an operating mode of the correcting apparatus from an ordinary mode to an adjusting mode in response to an external command. The control means can actuate the adjusting circuit in the ordinary mode to control the operating parameters of the electronic circuit, while the actuation data can be written into the memory means in the adjusting mode. In addition, an operating characteristic renewing means is provided for renewing the operating parameters of the electronic circuit by actuating the adjusting circuit based on predetermined adjustment data, when the operating mode of the correcting apparatus is switched to the adjusting mode by the operating mode switching means. And, a data storing means is provided for storing the adjustment data as renewed actuation data, if necessary together with the detection signal sensed by the temperature sensor as related temperature data, into the memory means when the adjustment data are effectively used by the operating characteristic renewing means for actuating the adjusting circuit at a time a memory command is entered from an outside.

Preferably, a power-on actuating circuit is provided for forcibly closing a designated one of the adjusting switches during a power-on operation of the electronic circuit. More specifically, the designated adjusting switch is closed until the power voltage reaches a value required for the control means to start its operation. In this case, another actuation circuit is provided separately from the power-on actuating circuit, for forcibly opening the adjusting switches other than the designated adjusting switch during the power-on operation of the electronic circuit.

Moreover, it is preferable to provide an overlap period for ON durations of two adjusting switches to be switched in a switching operation, so that all of the adjusting switches are not opened simultaneously.

BRIEF DESCRIPTION OF THE DRAWINGS

The above and other objects, features and advantages of the present invention will become more apparent from the following detailed description which is to be read in conjunction with the accompanying drawings, in which:

FIGS. 3A and 3B are circuit diagrams showing detained arrangements of actuating circuits for actuating analog switches in the power source circuit in accordance with the preferred embodiment of the present invention;

FIG. 4A is a circuit diagram showing a detailed arrangement of a temperature sensor incorporated in the semiconductor integrated circuit in accordance with the preferred embodiment of the present invention, while FIG. 4B is an equivalent circuit of the temperature sensor shown in FIG. 4A;

FIG. 6 is a flowchart showing a control processing executed by the microcomputer during an ordinary mode in accordance with the preferred embodiment of the present invention;

DESCRIPTION OF A PREFERRED EMBODIMENT

A preferred embodiment of the present invention will be explained hereinafter with reference to accompanied drawings.

Figure 1:
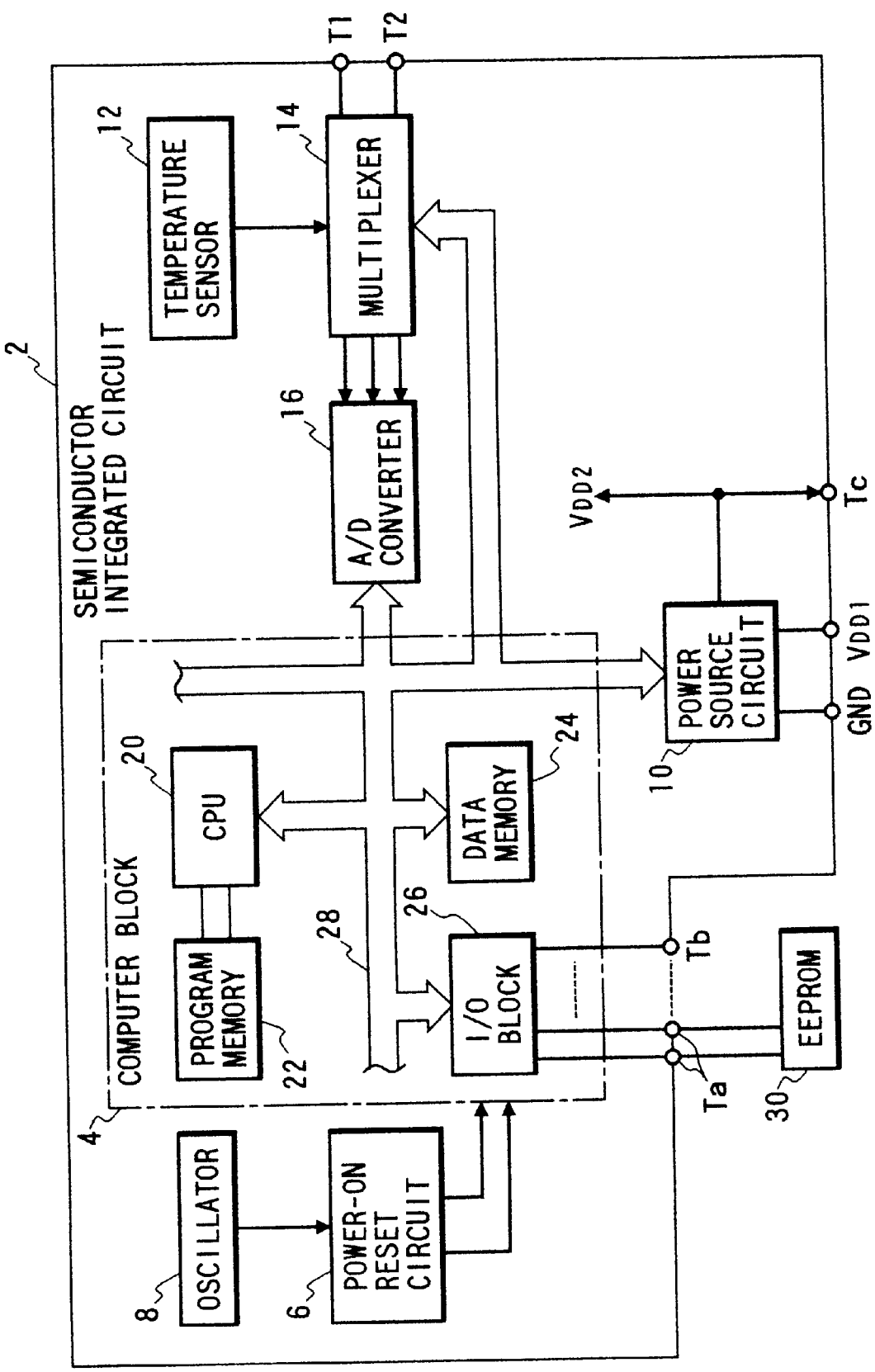
FIG. 1 is a schematic block diagram showing an arrangement of a semiconductor integrated circuit in accordance with a preferred embodiment of the present invention.

FIG. 1 is a schematic block diagram showing an arrangement of a semiconductor integrated circuit in accordance with a preferred embodiment of the present invention. A semiconductor integrated circuit 2 of this preferred embodiment is used as an electronic control apparatus for actuating a meter of an automotive vehicle. For example, in response to a detection signal obtained from a vehicle speed sensor or an engine speed sensor, the semiconductor integrated circuit 2 controls or energizes a cross coil of a speed meter or a tachometer so that, through this control or energization, a precise indication corresponding to the detected signal is given by the speed meter or tachometer.

As shown in FIG. 1, the semiconductor integrated circuit 2 of this embodiment comprises a computer block 4, a power-on reset circuit 6, an oscillator 8, a power source circuit 10, a temperature sensor 12, a multiplexer 14, and an A/D converter 16. These components 4–16 are collectively mounted on an IC substrate of CMOS and integrally molded by a resin or the like, as a single chip electronic component.

More specifically, the computer block 4 serves as a microcomputer. The power-on reset circuit 6 continuously produces a power-on reset signal in response to a power-on action of the semiconductor integrated circuit 2 until an internal power voltage $V_{DD2}$ reaches a predetermined power-on reset voltage $V_{PON}$ that is a voltage required for assuring an ordinary operation of the computer block 4. Once the internal power voltage $V_{DD2}$ reaches the power-on reset voltage $V_{PON}$, the power-on reset circuit 6 stops the generation of the power-on reset signal and supplies a machine clock to the computer block 4 to start up the operation of computer block 4.

The oscillator 8 produces an oscillation signal and supplies this oscillation signal, as the above-described machine clock, to the power-on reset circuit 6. The power source circuit 10 is connected to an input terminal $V_{DD1}$ for receiving an external power voltage $V_{DD1}$ entered from the external power line and used for actuating a meter. The power source circuit 10 produces the power voltage $V_{DD2}$ (constant voltage) for actuating internal circuits. The temperature sensor 12 detects the temperature of the semiconductor integrated circuit 2. The multiplexer 14 is connected to the temperature sensor 12. Two input terminals T1 and T2, entering analog signals, are connected to the multiplexer 14. One of analog signals entered from input terminals T1 and T2 is selected by the multiplexer 14 in accordance with a command fed from the computer block 4. And, the A/D converter 16 receives the analog signals selected by the multiplexer 14 and converts them into digital data which are sent to the computer block 4.

Computer block 4 comprises a CPU 20, a program memory 22 of ROM, a data memory 24 of RAM, an I/O block 26 (i.e., input/output port), and a bus line 28. The bus line 28, including a data bus, an address bus and a control bus, connects not only the components in the computer block 4 but the power source circuit 10, multiplexer 14 and A/D converter 16.

The I/O block 26 has a function of inputting detection signals from a vehicle speed sensor or the like to the semiconductor integrated circuit 2 as well as a function of outputting control signals to an external actuation circuit for actuating a meter from the semiconductor integrated circuit 2. Thus, the I/O block 26 has numerous input and output terminals for inputting and outputting various signals. Among them, terminals Ta are connected to an external EEPROM 30 which stores actuation data necessary for controlling the operating characteristics of the power source circuit 10. Under the control based on these actuation data, a constant power voltage $V_{DD2}$ is always supplied from the power source circuit 10. When required, these actuation data are read out through terminals Ta. Another terminal Tb is provided to input a command signal for setting optimum actuation data based on the checking result of the operating characteristics of the power source circuit 10.

EEPROM 30 corresponds to a memory means of the present invention. The power source circuit 10 corresponds to an electronic circuit having operating characteristics to be corrected by the present invention. An output line of the power voltage $V_{DD2}$ of the power source circuit 10 is connected to a terminal Tc. This terminal Tc is used to allow an operator to detect the power voltage $V_{DD2}$ of the semiconductor integrated circuit 2 from the outside.

Figure 2:
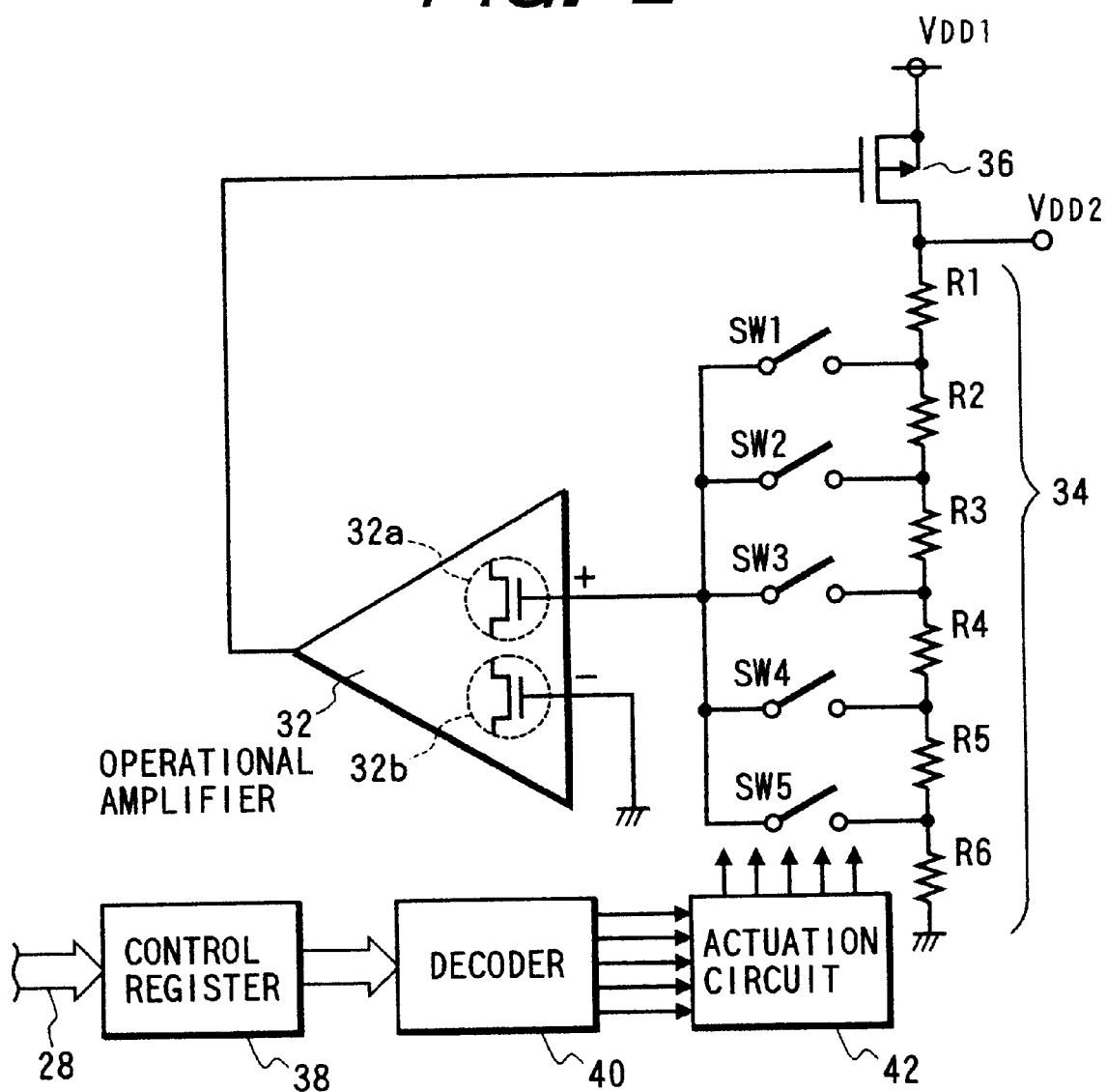
FIG. 2 is a circuit diagram showing a detained arrangement of a power source circuit of the semiconductor integrated circuit in accordance with the preferred embodiment of the present invention.

The power source circuit 10, as shown in FIG. 2, comprises an operational amplifier 32, a resistance dividing circuit 34 consisting of a total of six resistors R1–R6 serially connected, a MOS-FET (field effect transistor) 36 of a P-channel type (abbreviated PCH, hereinafter), and analog switches SW1–SW5. More specifically, the resistance dividing circuit 34 is connected, at one end (i.e., a lowest potential point) of the resistor R6, to the ground line (GND) of the semiconductor integrated circuit 2. PCH-type MOS-FET 36 has a source connected to an input line of power voltage $V_{DD1}$ (e.g., 6 V) supplied from the outside, and a drain connected to one end (i.e., a highest potential point) of the resistor R1 of the resistance dividing circuit 34. Analog switches SW1–SW5 are respectively interposed between a non-inversion input terminal (+) of the operational amplifier 32 and each connecting point of resistors R1–R6 constituting the resistance dividing circuit 34.

An inversion input terminal (−) of the operational amplifier 32 is connected to the GND of the semiconductor integrated circuit 2. An output terminal of the operational amplifier 32 is connected to a gate of the FET 36. In the operational amplifier 32, MOS-FET 32a and 32b cooperatively consisting of an input section are connected to the non-inversion input terminal (+) and the inversion input terminal (−), respectively. By the function of MOS-FET 32a and 32b, a threshold voltage of the non-inversion input terminal (+) is set higher than a threshold voltage of the inversion input terminal (−) by a predetermined voltage (e.g., 1.0 V).

When the semiconductor integrated circuit 2 is turned on, i.e., when the power voltage $V_{DD1}$ builds up, only the analog switch SW3 is closed among the five analog switches SW1–SW5. This condition is referred to as an initial condition. The condition of analog switches SW1–SW5 is flexibly changed in accordance with a later-described control procedure. In other words, analog switches SW1–SW5 are selectively closed in accordance with the control procedure.

More specifically, the above-described power source circuit 10 is controlled in the following manner. When the analog switch SW3 is closed, a dividing voltage corresponding to the connecting point between resistors R3 and R4 is applied to the non-inversion input terminal of the operational amplifier 32. The operational amplifier 32 controls the gate voltage of FET 36 to equalize the dividing voltage with a referential voltage determined by the difference in the threshold voltage between two input terminals. For example, when the dividing voltage is higher than the referential voltage, the operational amplifier 32 produces a high-level output signal. The high-level output signal of operational amplifier 32 turns off the FET 36. On the contrary, when the dividing voltage is lower than the referential voltage, the operational amplifier 32 produces a low-level output signal. The low-level output signal of operational amplifier 32 turns on the FET 36.

In this manner, the operational amplifier 32 and FET 36 cooperatively control the current flowing across the resistance dividing circuit 34, so that the voltage applied between both ends of resistors R4–R6 is equalized with the referential voltage. A connecting point between the resistance dividing circuit 34 and FET 36 serves as an output terminal for the internal power voltage $V_{DD2}$ (e.g., 5 V). The electrical potential of $V_{DD2}$ output terminal is determined by the switching condition of the resistance dividing circuit 34. A ratio of the electrical potential of $V_{DD2}$ output terminal to the referential voltage is identical with a dividing ratio of the resistance dividing circuit 34. For example, when the analog switch SW3 is closed, the $V_{DD2}$ output terminal produces a power voltage $V_{DD2}$ in accordance with the dividing ratio corresponding to the connecting point between resistors R3 and R4, which is equivalent to a product of $\{(R1+R2+R3+R4+R5+R6)/(R4+R5+R6)\}$ and the referential voltage.

According to the present embodiment, the provision of analog switches SW1–SW5 disposed at respective connecting points of resistors R1–R6 constituting the resistance dividing circuit 34 makes it possible to flexibly change the dividing point of the resistance dividing circuit 34 to apply a dividing voltage to the non-inversion input terminal (+) of the operational amplifier 32. This is because that setting the threshold voltage of FET accurately in the CMOS process is difficult. According to this embodiment, the threshold voltage difference at the input section of the operational amplifier 32 is used as the referential voltage for determining the power voltage $V_{DD2}$. Hence, the power voltage $V_{DD2}$ is sensitively fluctuated in accordance with a variation of the referential voltage.

More specifically, in the power source circuit 10 of the present embodiment, the power voltage $V_{DD2}$ is produced by amplifying the threshold voltage difference at the input section of the operational amplifier 32 by an amplification factor determined based on the dividing ratio of the resistance dividing circuit 34. Thus, the power voltage $V_{DD2}$ is widely changed in accordance with a variation of the referential voltage. This may make it difficult to assure a normal operation in each component of the semiconductor integrated circuit 2.

To solve this problem, the present embodiment adopts a novel arrangement. To this end, as described above, the resistance dividing circuit 34 is used to determine the amplification factor of the referential voltage for the power source circuit 10. The resistance dividing circuit 34 is constituted by a total of six resistors R1–R6 connected in series. As an adjusting circuit, a total of five analog switches SW1–SW5 are provided at respective connecting points of six resistors R1–R6. Thus, the dividing point of the resistance dividing circuit 34 is selectively switched among the thus-provided five stages having different electrical potentials. In other words, the arrangement shown in FIG. 2 makes it possible to absorb the fluctuation of the power voltage $V_{DD2}$, if caused due to a variation of the referential voltage, by selectively choosing an optimum amplification factor among the five options.

To realize the above-described switching operation for the amplification factor, the power source circuit 10 further comprises a control register 38, a decoder 40 and an actuation circuit 42. The actuation data stored in EEPROM 30 are written into the control register 38 in accordance with a later-described control procedure executed by CPU 20 after the semiconductor integrated circuit 2 is activated by the power voltage $V_{DD1}$. The decoder 40 produces an actuation signal (i.e., a high-level signal) to select one of five analog switches SW1–SW5 as a designated switch to be closed in accordance with the actuation data written in the control register 38. The actuation circuit 42 forcibly closes the analog switch SW3 for a predetermined duration immediately after the semiconductor integrated circuit 2 is activated until the actuation data are written into the control register 38. Once the actuation data are completely written into the control register 38, the actuation circuit 42 flexibly closes one of analog switches SW1–SW5 in accordance with the actuation data.

When the semiconductor integrated circuit 2 is turned on, the power source circuit 10 produces the power voltage $V_{DD2}$. In response to this power voltage $V_{DD2}$, the power-on reset circuit 6 is activated. However, there is a significant time lag between the activation of the power-on reset circuit 6 and an operational start-up of CPU 2. During this time lag, the data values stored in the control register 38 cannot be stabilized. This is why the analog switch SW3 is forcibly closed for a predetermined duration immediately after the semiconductor integrated circuit 2 is turned on until the data values of the control register 38 are stabilized. Thus, the power source circuit 10 stably produces the power voltage $V_{DD2}$ at an initial stage of the start-up operation of CPU 2.

To realize this, as shown in FIGS. 3A and 3B, the actuation circuit 42 comprises a first actuation circuit 42a that forcibly closes the analog switch SW3 immediately after the semiconductor integrated circuit 2 is turned on, and a second actuation circuit 42b that forcibly opens other analog switches SW1, SW2, SW4 and SW5 immediately after the semiconductor integrated circuit 2 is turned on.

More specifically, as shown in FIG. 3A, the first actuation circuit 42a roughly consists of a $V_{DD1}$ group logic circuit operated by the power voltage $V_{DD1}$ and a $V_{DD2}$ group logic circuit operated by the power voltage $V_{DD2}$ produced by the power source circuit 10.

The $V_{DD2}$ group logic circuit comprises a first NOT circuit (denoted by NOT1 in the drawing) that inverts the power-on reset signal produced from the power-on reset circuit 6, a resistor R connecting an output terminal of the first NOT circuit to the GND, and a second NOT circuit (denoted by NOT2 in the drawing) that inverts the actuation signal (i.e. a high-level signal when analog switch SW3 is closed) produced from the decoder 40. The $V_{DD1}$ group logic circuit comprises a first level shifter LS1 that shifts the output level of the first NOT circuit to the $V_{DD1}$ group voltage, a third NOT circuit (denoted by NOT3 in the drawing) having an input terminal connected to the GND, a first NAND circuit (referred to NAND1 in the drawing) operable in response to the outputs of the third NOT circuit and the first level shifter LS1, a fourth NOT circuit (denoted by NOT4 in the drawing) that inverts an output of the first NAND circuit, a second level shifter LS2 that shifts the output level of the second NOT circuit to the $V_{DD1}$ group voltage, and a second NAND circuit (denoted by NAND2 in the drawing) operable in response to the outputs of the second level shifter LS2 and the fourth NOT circuit.

Analog switch SW3 is constituted by a combination of a PCH type MOS-FET and an N-channel (abbreviated NCH, hereinafter) type MOS-FET. An output of the second NAND circuit is inverted by a fifth NOT circuit (denoted by NOT5 in the drawing) and entered into the gate of the PCH type FET. Meanwhile, the output of the second NAND circuit is directly entered into the gate of the NCH type FET. Accordingly, the analog switch SW3 is closed when the second NAND circuit produces a high-level signal, and is opened when the second NAND circuit produces a low-level signal. Furthermore, according to the present embodiment, the above-described logic circuits are formed on an IC substrate of CMOS. Each component, including analog switch SW3, can be operated by the threshold voltage $V_T$ of approximately 1.2 V.

Hereinafter, an operation of the actuation circuit 42 will be explained with reference to the time charts shown in FIGS. 7A–7C and 8.

Figure 7A:
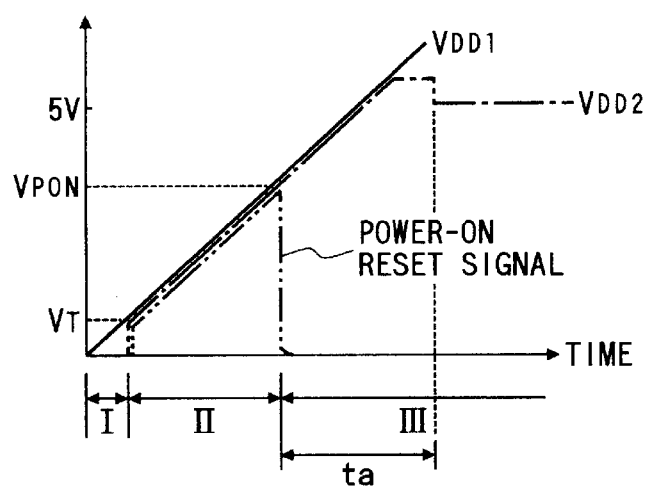
FIGS. 7A–7C are time charts showing an operation of an actuation circuit incorporated in the semiconductor integrated circuit in accordance with the preferred embodiment of the present invention.
Figure 7B:
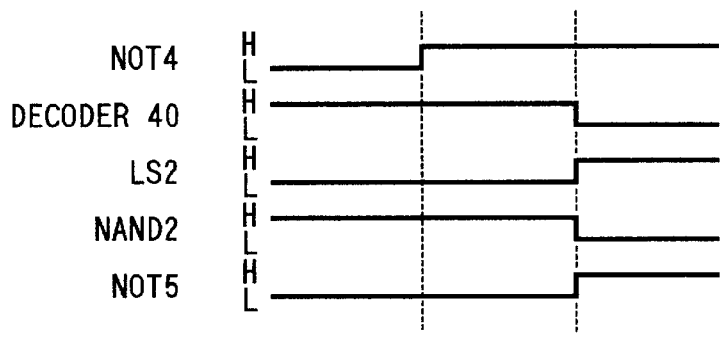

According to the first actuation circuit 42a having the above-described arrangement, the power-on reset circuit 6 does not start its operation immediately after a power-on operation until the power voltage $V_{DD2}$ reaches the threshold voltage $V_T$ (refer to a duration I in the time chart of FIG. 7A). The output of the first NOT circuit is not stabilized. However, as the output terminal of first NOT circuit is connected to the GND via the resistor R, one input terminal of the first NAND circuit is always grounded (0V). When the power voltage $V_{DD1}$ reaches the threshold voltage $V_T$ of the first NAND circuit, a high-level signal is produced from the first NAND circuit. This high-level signal is entered through the fourth NOT circuit to one input terminal of the second NAND circuit. Thus, the second NAND circuit always produces a high-level signal. As a result, the analog switch SW3 is closed.

When the power voltage $V_{DD2}$ exceeds the threshold voltage $V_T$ (refer to a duration II), the power-on reset circuit 6 starts its operation. After that, the power-on reset circuit 6 produces a power-on reset signal (i.e., a high-level signal) continuously until the power voltage $V_{DD2}$ reaches the power-on reset voltage $V_{PON}$. Accordingly, in a build-up phase of the power voltage $V_{DD2}$, the first NOT circuit produces a low-level signal whenever the power voltage $V_{DD2}$ is somewhere in a range between the threshold voltage $V_T$ and the power-on reset voltage $V_{PON}$. In this condition, each of the first NAND circuit and the second NAND circuit always produces a high-level signal. Thus, the analog switch SW3 is closed.

When the power voltage $V_{DD2}$ reaches the power-on reset voltage $V_{PON}$ (refer to a duration II), the power-on reset signal is no longer produced from the power-on reset circuit 6. The output of the first NOT circuit is hence reversed from a low level to a high level. In this case, the third NOT circuit produces a high-level signal. Thus, two input terminals of the first NAND circuit receive high-level signals. A low-level signal is produced from the first NAND circuit. This low-level signal is entered through the fourth NOT circuit to one input terminal of the second NAND circuit.

An actuation signal, supplied from the decoder 40, is inverted in the second NOT circuit and entered through the second level shifter LS2 to the other input terminal of the second NAND circuit. When the decoder 40 produces a high-level actuation signal (refer to FIG. 7B), a low-level signal is entered into the other input terminal of the second NAND circuit. In this case, a high-level signal is produced from the second NAND circuit. Thus, the analog switch SW3 is closed On the contrary, when the decoder 40 produces a low-level actuation signal, a high-level signal is entered into the other input terminal of the second NAND circuit. Thus, a low-level signal is produced from the second NAND circuit. The analog switch SW3 is opened.

In this manner, for a duration immediately after the semiconductor integrated circuit 2 is powered on until the power voltage $V_{DD2}$ reaches the power-on reset voltage $V_{PON}$ required for the computer block 4 to start its operation, the first actuation circuit 42a continuously sends a high-level signal to the analog switch SW3 by holding a high-level output signal of the second NAND circuit. Thus, the analog switch SW3 is forcibly turned on. Once the power voltage $V_{DD2}$ reaches the power-on reset voltage $V_{PON}$ (refer to a duration III), i.e., when the computer block 4 starts the operation, the output signal of the second NAND circuit is selectively switched between a high level and a low level in accordance with the actuation signal supplied from the decoder 40. Thus, the on-and-off condition of analog switch SW3 is controlled in accordance with the actuation data written from the computer block 4 into the control register 38.

Next, an arrangement of the second actuation circuit 42b for the remaining switches SW1, SW2, SW4 and SW5 will be explained with reference to FIG. 3B. The second actuation circuit 42b is similar to the first actuation circuit 42a except for the following features.

The second NOT circuit is omitted. The actuation signals, supplied from the decoder 40 for actuating the analog switches SW1, SW2, SW4 and SW5, are directly entered into the second level shifter LS2. The output of the second NAND circuit is directly supplied to the gate of the PCH-type MOS-FET constituting one side of each of the analog switches SW1, SW2, SW4 and SW5. On the other hand, the output of the second NAND circuit is inverted by a sixth NOT circuit (denoted by NOT6 in the drawing) and supplied to the gate of the NCH-type MOS-FET constituting the other side of each of the analog switches SW1, SW2, SW4 and SW5.

Figure 7C:
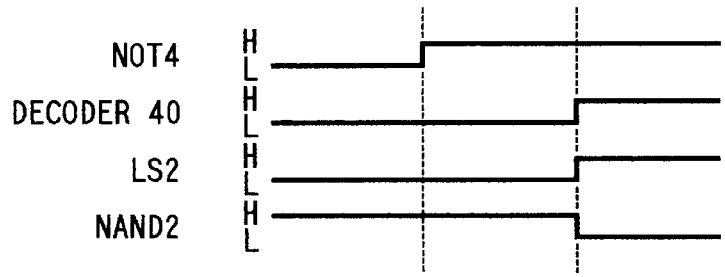

According to the second actuation circuit 42b having the above-described arrangement, for a duration immediately after the semiconductor integrated circuit 2 is powered on until the power voltage $V_{DD2}$ reaches the power-on reset voltage $V_{PON}$ (i.e. duration I of FIG. 7A), each of the first NAND circuit and the second NAND circuit always produces a high-level signal in the same manner as the first actuation circuit 42a (refer to FIG. 7C). Thus, the analog switches SW1, SW2, SW4 and SW5 are kept in an opened condition.

When the power voltage $V_{DD2}$ reaches the power-on reset voltage $V_{PON}$ (i.e., duration II), the first NAND circuit produces a low-level signal. This low-level signal is inverted into a high-level signal through the fourth NAND circuit (refer to FIG. 7C). This high-level signal is entered into one input terminal of the second NAND circuit. Meanwhile, an actuation signal, supplied from the decoder 40, is entered through the second level shifter LS2 to the other input terminal of the second NAND circuit. When the decoder 40 produces a high-level actuation signal, a high-level signal is entered into the other input terminal of the second NAND circuit. In this case, a low-level signal is produced from the second NAND circuit. The analog switch (i.e., analog switches SW1, SW2, SW4 and SW5) is closed.

On the contrary, when the decoder 40 produces a low-level actuation signal (FIG. 7C), a low-level signal is entered into the other input terminal of the second NAND circuit. Thus, a high-level signal is produced from the second NAND circuit. The analog switch (i.e., analog switchs SW1, SW2, SW4 and SW5) is opened.

In this manner, for a duration immediately after the semiconductor integrated circuit 2 is turned on until the power voltage $V_{DD2}$ reaches the power-on reset voltage $V_{PON}$ required for the computer block 4 to start its operation, the second actuation circuit 42b forcibly opens each of the analog switches SW1, SW2, SW4 and SW5. Once the power voltage $V_{DD2}$ reaches the power-on reset voltage $V_{PON}$, i.e., when the computer block 4 starts its operation, the on-and-off condition of each analog switch (SW1, SW2, SW4 and SW5) is controlled in accordance with the actuation data supplied from the decoder 40.

In FIG. 7A, the duration III is a region in which the on-and-off control of each analog switch (SW1, SW2, SW4 and SW5) is allowed in accordance with a given program (i.e., in accordance with the actuation data supplied from the decoder 40). A duration "ta" is a time required for accomplishing a writing operation of the actuation data into the register by the program control. In other words, an actual switching operation of the analog switches starts after this duration "ta" is elapsed. Upon completion of the writing operation of the actuation data, the power voltage $V_{DD2}$ is adjusted to a value closer to the rated voltage (e.g., 5 V) as shown in FIG. 7A.

CPU 20 performs an initial processing for responding to the cease of the power-on reset signal. More specifically, CPU 20 has a function of writing initial actuation data required for closing the analog switch SW3 into the control register 38 of the power source circuit 10. Subsequently, CPU 20 performs a later-described control processing to rewrite or renew the actuation data of the control register 38 by the actuation data stored in EEPROM 30.

The decoder 40, when the actuation data in the control register 38 are rewritten, starts sending an actuation signal (i.e., high-level signal) to a designated analog switch to be switched from an OFF condition to an ON condition in accordance with the thus-rewritten actuation data. Subsequently, the decoder 40 sends an actuation signal (i.e., low-level signal) to another analog switch to be switched from an ON condition to an OFF condition in accordance with the thus-rewritten actuation data.

If an input signal of the operational amplifier 32 is unstable, the power source circuit 10 cannot be controlled. To prevent any failure, it is necessary to prevent all of the analog switches SW1–SW5 from being opened siultaneously. To this end, a switch, if having been closed immediately before the actuation data are rewritten, is closed for a while during a switching operation among analog switches SW1–SW5.

Figure 8:
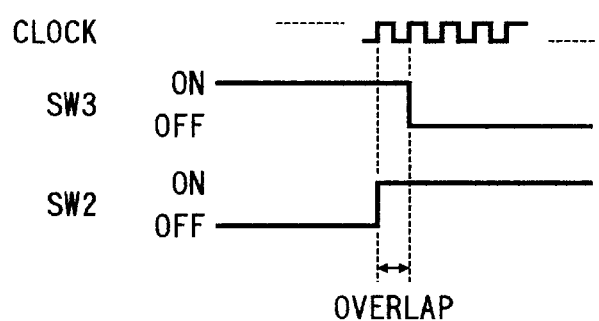
FIG. 8 is a time chart showing details of a switching operation of analog switches in accordance with the preferred embodiment of the present invention.

FIG. 8 is a time chart showing the details of a switching operation between the analog switches SW2 and SW3. According to this embodiment, an overlap period equivalent to one machine clock is provided for a switching operation. This is effective to stabilize the power source voltage $V_{DD2}$ during such a switching operation. More specifically, if a turning-on timing of the analog switch SW3 is synchronized with a turning-off timing of the analog switch SW2, there will be a possibility that all of the analog switches will be turned off (i.e. opened) simultaneously for a moment. This causes a fluctuation in the power source voltage $V_{DD2}$, leading to a malfunction of the circuit.

Figures 4A, 4B:
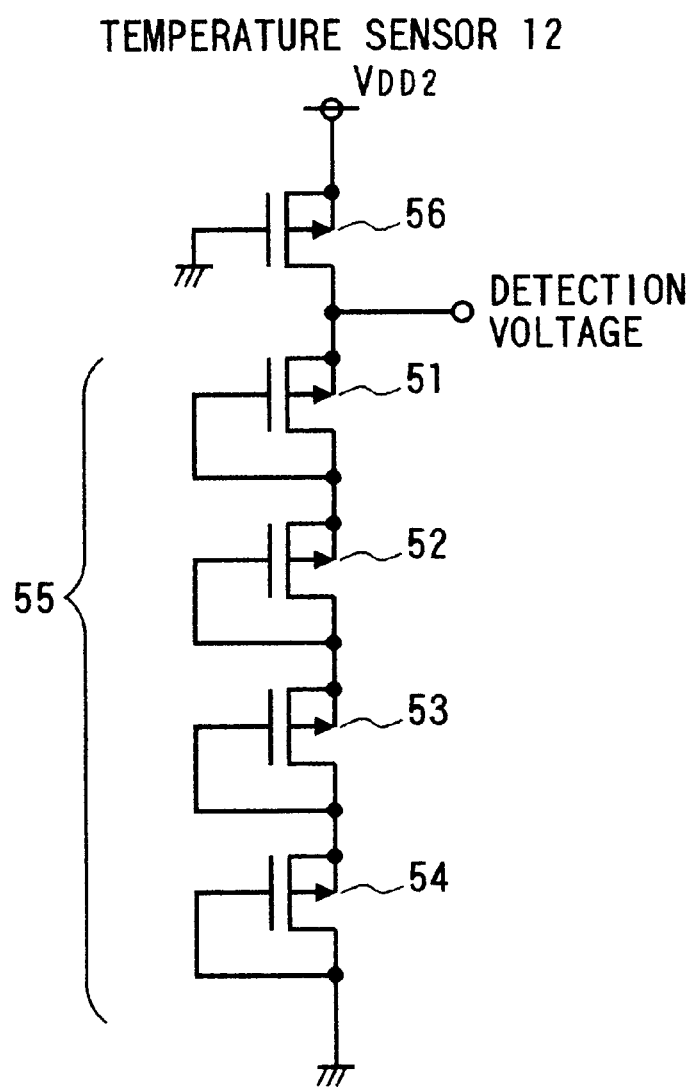

The temperature sensor 12, as shown in FIG. 4A, comprises a total of four, serially connected PCH-type MOS-FET 51, 52, 53 and 54 each having a gate and a drain connected directly. Among MOS-FET 51, 52, 53 and 54, a drain of one FET is connected to a source of the next (i.e., lower) FET and the drain of the lowermost MOS-FET 54 is connected to the GND, thereby constituting a series circuit 55 of MOS-FET. The source of the uppermost FET 51 is connected to a drain of another PCH-type MOS FET 56. The power voltage $V_{DD2}$ is applied to a source of the FET 56. A gate of the FET 56 is connected to the GND. An electrical potential of a connecting point between FET 51 and FET 56 is sent to the multiplexer 14 as a detection voltage representing the temperature of the semiconductor integrated circuit 2.

According to the temperature sensor 12 thus constituted, FET 56 serves as a constant-current source flowing a tiny current to the series circuit 55. Each of four FET 51–54, constituting the series circuit 55, acts as a diode turned on by the threshold voltage $V_T$. FIG. 4B shows an equivalent circuit of the temperature sensor 12.

In short, the detection voltage sent to the multiplexer 14 is identical with four times the threshold voltage $V_T$. Each threshold voltage $V_T$ of four FET 51–54 is variable in accordance with the temperature. The detection signal is sent to the computer block 4 via the A/D converter 16. Thus, the computer block 4 detects the temperature of the semiconductor integrated circuit 2.

More specifically, the threshold voltage of the MOS FET varies largely depending on a manufacturing process of an IC substrate (wafer) constituting this MOS FET. However, the temperature characteristics is derived from the physical properties of the semiconductor and therefore kept constant. For example, a measurement of the detection voltage is done beforehand at a room temperature. The detected value is written in EEPROM 30 as an initial value. When the semiconductor integrated circuit 2 is in use, a detection signal obtained from the temperature sensor 12 is compared with the initial value stored in EEPROM 30. A voltage difference thus obtained is then divided by the temperature characteristics (several mV/° C.) relevant to the detection voltage, to obtain a temperature change or deviation from the room temperature.

The above-described semiconductor integrated circuit 2 performs an initial setting processing for storing actuation data to EEPROM 20 as well as a control processing for correcting the output characteristics of the power source circuit 10 based on the actuation data stored in EEPROM 30 during an operation of the semiconductor integrated circuit 2.

Figure 5:
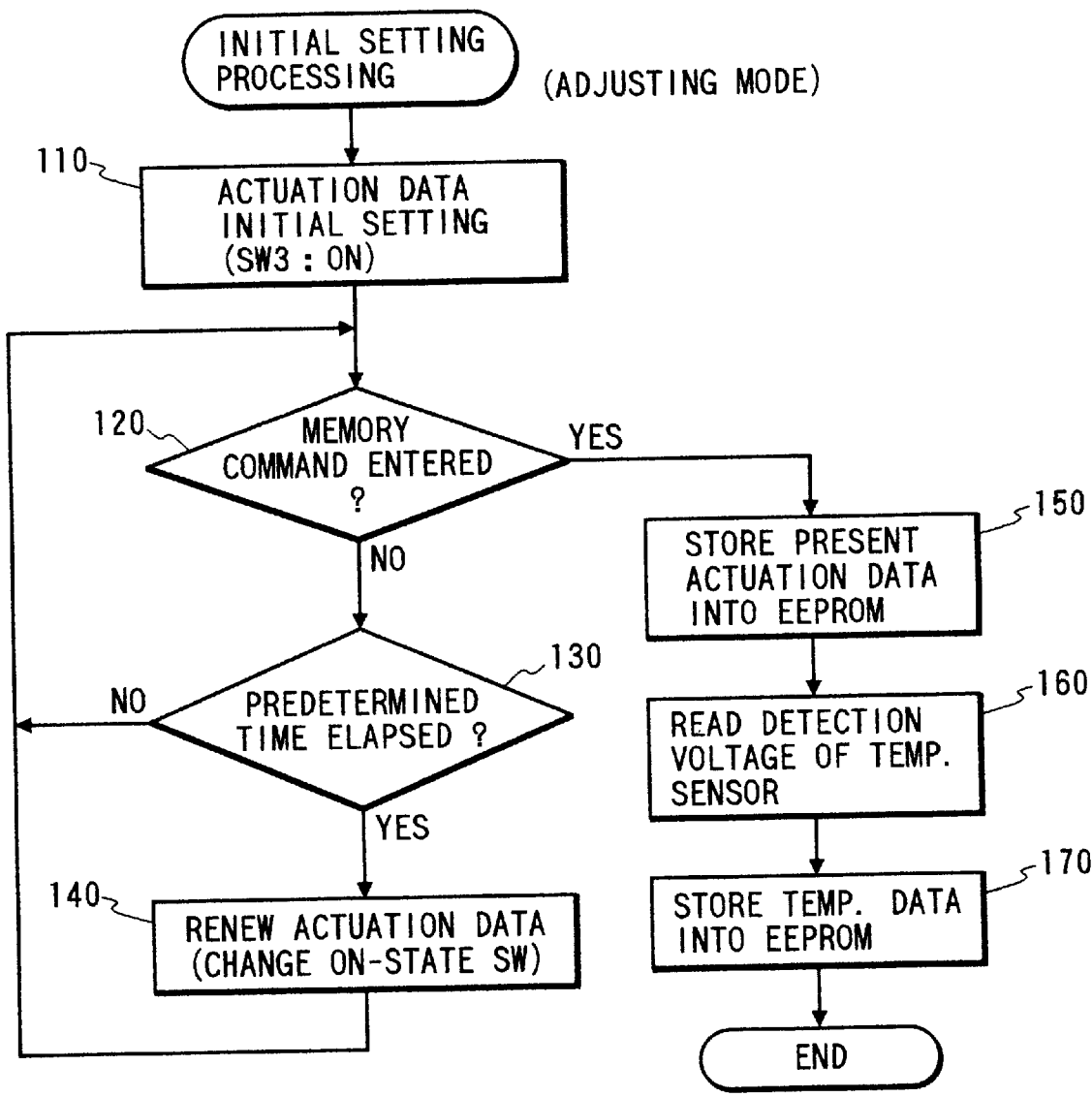
FIG. 5 is a flowchart showing an initial setting processing executed by a microcomputer during an adjusting mode in accordance with the preferred embodiment of the present invention.

As shown in the flowchart of FIG. 5, the initial setting processing is executed in response to a mode switching command that is entered from the terminal Tb to change the operating mode of semiconductor integrated circuit 2 from an ordinary mode to an adjusting mode. CPU 20 reads a control program from the program memory 22 for executing this processing.

After the initial setting processing is started, in step 110, the initial values for the actuation data are sent to the control register 38 of the power source circuit 10 to turn on the analog switch SW3. In the next step 120, a judgement is made as to whether a memory command of actuation data is entered from the terminal Tb. If no memory command is entered, it is then checked in step 130 whether a predetermined time has elapsed after the actuation data are written into the control register 38. If the predetermined time has not elapsed yet, the control flow returns to the step 120 again. By repeating this procedure, an entry of the memory command from the terminal Tb is monitored for the predetermined time after the analog switch SW3 is closed based on the actuation data written in the control register 38.

When no memory command is entered for the predetermined time, i.e., when the judgement result is YES in step 130, the control flow proceeds to the next step 140. In the step 140, the actuation data stored in the control register 38 are renewed by another actuation data to close one of the remaining analog switches that are not yet closed. After finishing the renewal of the actuation data, the control flow returns to the step 120 again. Then, executing the procedure of steps 120 and 130, an entry of the memory command from the terminal Tb is monitored for the predetermined time after the actuation data are renewed in the control register 38. When no memory command is entered for the predetermined time, i.e., when the judgement result is YES in step 130, the control flow proceeds to the next step 140 to renew the actuation data stored in the control register 38 by another actuation data to close one of the remaining analog switches that are not yet closed.

In other words, the processing performed in the steps 110–140 is a sequential switching operation for closing five analog switches SW1–SW5 successively at intervals of the predetermined time in accordance with the predetermined adjusting data. As described above, these five analog switches SW1–SW5 are used for varying the power voltage $V_{DD2}$ in the power source circuit 10. The analog switch SW3 is a referential switch to be closed first. After the analog switch SW3 is closed the remaining analog switches are successively closed, for example, by an order of SW1→SW2→SW4→SW5. During this sequential switching operation, any entry of the memory command from the terminal Tb is monitored.

If the memory command is entered, i.e., when the judgement result is YES in step 120, the control flow proceeds to step 150. In the step 150, the actuation data of control register 38, effective at the moment the memory command is entered, are written into EEPROM 30.

In the next step 160, the multiplexer 14 is set in a predetermined position to input a detection voltage from the temperature sensor 12. The detection voltage thus-entered is A/D converted by the A/D converter 16, and the converted digital data are read into the computer block 4. Subsequently, in step 170, the digital data of the detection voltage are written into EEPROM 30 as referential temperature data representing the temperature of the semiconductor integrated circuit 2 at the time the actuation data are set. Then, the initial setting processing is terminated.

As described above, the semiconductor integrated circuit 2 executes the initial setting processing when the mode switching command is entered through the terminal Tb to change the operating mode to the adjusting mode. The analog switches in the power source circuit 10 are successively closed. If the memory command is entered from the terminal Tb to memorize the actuation data, the actuation data effective at this moment (i.e., actuation data for closing the presently-selected analog switch) and the temperature data representing the temperature of the semiconductor integrated circuit 2 are stored in EEPROM 30.

Accordingly, while the above-described initial setting processing is executed by entering the mode switching command from the terminal Tb, the power voltage $V_{DD2}$ can be sensed or monitored from the outside by using a voltmeter connected to the terminal Tc. The memory command is entered from the terminal Tb at the moment the power voltage $V_{DD2}$ is within a predetermined and satisfactory voltage rage. In response to the memory command, EEPROM 30 stores both of the actuation data and the temperature data presently effective as data required for optimizing the power voltage $V_{DD2}$ under the present conditions.

According to the present embodiment, the initial setting processing executed by CPU 20 in accordance with the mode switching command entered from the terminal Tb corresponds to the operating mode switching means of the present invention. The above-described procedure of steps 110–140 corresponds to the operating characteristic renewing means of the present invention. The above-described procedure of steps 150–170 corresponds to the data storing means of the present invention.

The control processing, that corrects the output characteristics of the power source circuit 10 based on the actuation data stored in EEPROM 30, is repetitively executed together with other processing of CPU 20 to be executed, such as a meter control processing, once the semiconductor integrated circuit 2 is turned on.

Namely, after the semiconductor integrated circuit 2 is turned, the power voltage $V_{DD2}$ will reach the power-on reset voltage $V_{PON}$ that is required for the computer block 4 to start its operation. At the moment the power voltage $V_{DD2}$ has reached the power-on reset voltage $V_{PON}$, the power-on reset circuit 6 stops the generation of the power-on reset signal. CPU 20 is activated and starts an ordinary control processing shown in FIG. 6.

First, an initialization processing is executed in step 200. This initialization processing includes a processing for holding the ON-condition of the analog switch SW3 based on the initial values of the actuation data written in the control register 38 of power source circuit 10.

Next, in step 210, the detection voltage of the temperature sensor 12 is read in the same manner as in the step 160. The detection voltage obtained in step 210 is present temperature data ($D_{TH1}$) representing the momentary temperature of the semiconductor integrated circuit 2. Subsequently, in step 220, both of the actuation data and related temperature data ($D_{TH0}$) previously stored in EEPROM 30 are read out. Then, in step 230, a temperature change amount $\Delta T$ is calculated in the following manner.

Namely, a difference between the present temperature data ($D_{TH1}$) and the stored temperature data ($D_{TH0}$) is divided by the temperature characteristic (X mV/° C.) relevant to the detection voltage of the temperature sensor 12, to obtain the change $\Delta T$ {=$(D_{TH1}-D_{TH0})/X$} in the temperature from the time the actuation data are set in EEPROM 30.

Next, in step 240, the actuation data are corrected to optimum values corresponding to the present temperature based on the thus-obtained temperature change amount $\Delta T$ and the actuation data read out from EEPROM 30. A difference in the threshold voltage between input terminals of the operational amplifier 32 decreases with increasing temperature and increases with decreasing temperature. Thus, the power voltage $V_{DD2}$ needs to be maintained at the same value even when the threshold voltage difference is changed due to a temperature change.

For example, when EEPROM 30 stores the actuation data for closing the analog switch SW3, the temperature change amount $\Delta T$ may exceed a predetermined value because of a temperature increase at the semiconductor integrated circuit 2. In such a case, the power voltage $V_{DD2}$ is reduced. To compensate this reduction of the power voltage $V_{DD2}$, the actuation data are corrected to the values used for closing the analog switches SW4 or SW5 in accordance with the temperature change amount $\Delta T$. However, if the temperature change amount $\Delta T$ is a sufficient small value, no correction is done for the actuation data. In other words, the actuation data stored in EEPROM 30 are used repetitively without any correction.

After completing the correction of actuation data, the control flows proceeds to step 250 to write the corrected actuation data into the control register 38 of the power source circuit 10. As a result, the power source circuit 10 can produce the power voltage $V_{DD2}$ having a constant value. Thus, the operation of the semiconductor integrated circuit 2 can be stabilized.

After the actuation data are written into the control register 38 of the power source circuit 10, a meter actuating control processing is executed in step 260. The procedure of steps 210–250 is cyclically executed during the execution of the meter actuating control processing.

Accordingly, after the semiconductor integrated circuit 2 is activated, the temperature of the semiconductor integrated circuit 2 may be changed due to an ambient temperature change or a heat generation from the semiconductor integrated circuit 2 itself. In such a case, the actuation data are renewed to the optimum values in accordance with the resultant temperature change. Thus, the power source circuit 10 always produces a stabilized power voltage $V_{DD2}$. The procedure of steps 210–250 in this embodiment corresponds to the control means of the present invention.

As explained in the foregoing description, according to the semiconductor integrated circuit 2 of the present invention, a plurality of analog switches SW1–SW5 are provided in the power source circuit 10 to change the amplification factor of the-referential voltage. Any one of these analog switches SW1–SW5 is selected in accordance with the actuation data stored in EEPROM 30 and the related temperature data, so that the internal power voltage $V_{DD2}$ in a desirable voltage range can be always produced in the power source circuit 10.

This is advantageous compared with the prior art. For example, a manufacturing of the semiconductor integrated circuit 2 may be failed in that the resultant threshold voltages of FFT 32a and 32b constituting the input section of the operational amplifier 32 are different from the designated values. However, according to the present invention, there in no necessity of using a conventional laser trimming or the like to adjust the resistance value of a resistor constituting the resistance dividing circuit 34. In other words, the present invention requires a simple adjustment for setting a desired value for the power voltage $V_{DD2}$ produced in the power source circuit 10. Especially, the present invention senses and memorizes the representative temperature of the semiconductor integrated circuit 2 at the time the actuation data are set. After that, the semiconductor integrated circuit 2 is operated. The temperature data are momentarily sensed, to detect any change of the temperature. Then, if there is a significant temperature change, the actuation data are corrected based on the difference between the memorized temperature data and the present temperature data. Therefore, an undesirable temperature drift can be surely eliminated from the power voltage $V_{DD2}$.

Furthermore, the semiconductor integrated circuit 2 of the present embodiment provides the terminal Tc allowing an operator to measure the power voltage $V_{DD2}$ from the outside and the terminal Tb for changing the operating mode of the computer block 4 to the adjusting mode to execute the above-described initial setting processing. Thus, the adjustment of the power voltage (i.e., setting of the actuation data) can be performed on a chip body that is in a condition the semiconductor integrated circuit 2 is installed on an IC substrate, or even after this chip is molded by a resin. Accordingly, the semiconductor integrated circuit 2 of this embodiment allows an operator to adjust the power voltage $V_{DD2}$ even after it is installed in an automotive vehicle.

Yet further, the present embodiment utilizes the temperature sensor 12 incorporated in the semiconductor integrated circuit 2 to remove an undesirable temperature drift from the power voltage $V_{DD2}$. Thus, there is no necessity of providing a thermistor or the like generally used as a temperature sensor. This is advantageous in that the arrangement of a meter system, into which the semiconductor integrated circuit 2 of the present embodiment is incorporated, can be simplified. Furthermore, a meter system is generally subjected to an undesirable variation of a meter indication value due to a temperature change. Providing the temperature sensor 12 integrally on the semiconductor integrated circuit 2 is advantageous when this temperature sensor 12 is used to correct this kind of temperature variation in the meter indication value.

The present invention is not limited to the above-described embodiment, and can be modified in various ways.

For example, EEPROM used as memory means for memorizing actuation data can be replaced by any other non-volatile memory. However, when a read-only memory is used as memory means, a reading device dedicated for writing actuation data into this memory is necessary. This may be disadvantageous in that the actuation data cannot be written into EEPROM as an adjustment after the semiconductor integrated circuit is installed on an IC substrate.

Furthermore, according to the above-described embodiment, the amplification factor of the referential voltage can be adjusted among five grades in the power source circuit 10. However, the number of the resistors constituting the resistance dividing circuit 34 can be arbitrarily changed, as well as the number of the analog switches provided at respective connecting points of these resistors. Increasing the number leads to an improvement of resolution in the adjustment.

Yet further, the above-described embodiment uses an operational amplifier having different threshold voltages at its input terminals. The threshold voltage difference of this operational amplifier is used as a referential voltage for correcting the operating characteristics of the power source circuit, so that the power source circuit can produce a constant voltage. However, it is possible to use another operational amplifier that has the same threshold voltage at each input terminal. In this case, a referential voltage is applied to the non-inversion input terminal (−) by using a Zener diode or the like so as to produce a constant voltage from the power source circuit. Moreover, it will be possible to use an amplification circuit amplifying an input signal of a predetermined frequency and producing the amplified signal for controlling the operating characteristics of the power source circuit in accordance with the present invention.

Still further, the above-described embodiment uses a resistance dividing circuit consisting of a plurality of series resistors to adjust the amplification factor of the referential voltage in the power source circuit. These resistors can be replaced by series FFT, because the FFT serves as a resistor when its gate is fixed at an intermediate potential.

On the other hand, the temperature sensor disclosed in the above-described embodiment is constituted by a series circuit consisting of four stages of PCH-type FET. However, the number of FET stages can be changed adequately considering a required detection voltage and the threshold voltage of each FET. When the temperature sensor is incorporated in an integrated circuit, each FET of the series circuit can be constituted by an NCH-type FFT. Furthermore, according to the above-described embodiment, the uppermost stage of the FET series circuit is connected to the PCH-type FET 56 having a gate grounded which serves as a constant-current source. Thus, a direct current flows across the FET series circuit. However, the FET 56 can be replaced by a current-limiting resistor.

Moreover, according to the above-described embodiment, EEPROM is directly connected to the semiconductor integrated circuit 2 through the data input/output terminal Ta, so that the data can be written in or read from EEPROM in this condition. However, the data writing/reading operation to or from a non-volatile memory, such as EEPROM, can be performed by using a data communication, for example, through a serial I/F such as UART. Yet further, a LAN system equipped in a vehicle will be preferably utilized for performing the data writing/reading operation to or from the non-volatile memory.

With the above-described arrangement, the non-volatile memory can be positively used for storing other data not related to the operating characteristic correction of the electronic circuit. For example, when the above-described semiconductor integrated circuit is incorporated in a meter system of an automotive vehicle, the non-volatile memory can be used for memorizing the odometer values or impedance values for correcting the cross coil used in a speed meter or a tachometer. This leads to a significant size and cost down for the meter system.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. An operating characteristic correcting apparatus for correcting operating parameters of an electronic circuit, the correcting apparatus and the electronic circuit being formed on a single integrated circuit chip, the correcting apparatus comprising:

memory means for storing digital actuation data, the digital actuation data (i) being representative only of one output produced by said electronic circuit and (ii) for controlling only the operating parameters of said electronic circuit;

control means for reading said actuation data from said memory means during an operating condition of said electronic circuit; and adjusting means for adjusting the operating parameters, said adjusting means being actuated by said control means in accordance with the digital actuation data read from said memory means.

2. An operating characteristic correcting apparatus for correcting operating parameters of an electronic circuit, the apparatus comprising:

an adjusting circuit for adjusting operating parameters of said electronic circuit incorporated in an integrated circuit;

memory means for storing actuation data of said adjusting circuit determined beforehand for controlling the operating parameters of said electronic circuit; and control means for reading said actuation data from said memory means and actuating said adjusting circuit in accordance with said actuation data to control the operating parameters of said electronic circuit;

wherein said electronic circuit is a constant-voltage circuit comprising an operational amplifier utilizing a threshold voltage difference, a resistance dividing circuit, and a voltage-applying switching element applying a direct-current power voltage between both ends of said resistance dividing circuit, said operational amplifier controls said voltage-applying switching element to equalize an electrical potential of a dividing point of said resistance dividing circuit with said threshold voltage difference, so that said direct-current power voltage applied between the both ends of said resistance dividing circuit is equalized with an amplified voltage obtained by amplifying the threshold voltage difference of said operational amplifier by an amplification factor corresponding to a dividing ratio of said resistance dividing circuit, said adjusting circuit comprises a plurality of adjusting switches selectively closed to change the dividing point of said resistance dividing circuit to determine said amplification factor of said constant-voltage circuit, and said control means selectively closes one of said adjusting switches in accordance with said actuation data to determine the dividing ratio of said resistance dividing circuit, thereby producing a controlled direct-current constant voltage from said constant-voltage circuit.

3. The operating characteristic correcting apparatus in accordance with claim 2, wherein said integrated circuit incorporating said constant-voltage circuit has a terminal for outputting said direct-current constant voltage and a terminal for actuating said adjusting circuit.

4. The operating characteristic correcting apparatus in accordance with claim 1, further comprising a temperature sensor detecting a temperature of said electronic circuit, wherein said actuation data are corrected based on the temperature detected by said temperature sensor and said adjusting circuit is actuated based on the corrected actuation data, so as to eliminate undesirable temperature drift in the operating parameters of said electronic circuit.

5. An operating characteristic correcting apparatus for correcting operating parameters of an electronic circuit, the apparatus comprising:

an adjusting circuit for adjusting operating parameters of said electronic circuit incorporated in an integrated circuit;

memory means for storing actuation data of said adjusting circuit determined beforehand for controlling the operating parameters of said electronic circuit:

control means for reading said actuation data from said memory means and actuating said adjusting circuit in accordance with said actuation data to control the operating parameters of said electronic circuit; and a temperature sensor for detecting a temperature of said electronic circuit, wherein said actuation data are corrected based on the temperature detected by said temperature sensor and said adjusting circuit is actuated based on the corrected actuation data, so as to eliminate undesirable temperature drift in the operating parameters of said electronic circuit, and said temperature sensor comprises a series circuit consisting of a plurality of MOS-type field effect transistors each having a gate and a drain directly connected, and a voltage applied between both ends of said series circuit, the voltage being equivalent to a sum of threshold voltages of said plurality of MOS-type field effect transistors, is outputted from said temperature sensor as a detection sensor representing the temperature of said electronic circuit.

6. An operating characteristic correcting apparatus for correcting operating parameters of an electronic circuit, the apparatus comprising:

an adjusting circuit for adjusting operating parameters of said electronic circuit incorporated in an integrated circuit;

memory means for storing actuation data of said adjusting circuit determined beforehand for controlling the operating parameters of said electronic circuit;

control means for reading said actuation data from said memory means and actuating said adjusting circuit in accordance with said actuation data to control the operating parameters of said electronic circuit; and a temperature sensor for detecting a temperature of said electronic circuit, wherein said actuation data are corrected based on the temperature detected by said temperature sensor and said adjusting circuit is actuated based on the corrected actuation data, so as to eliminate undesirable temperature drift in the operating parameters of said electronic circuit, said memory means stores (i) temperature data sensed by said temperature sensor when said actuation data are set and (ii) said actuation data, and said control means corrects said actuation data based on the temperature data stored in said memory means and a present temperature sensed by said temperature sensor.

7. The operating characteristic correcting apparatus in accordance with claim 1, further comprising:

operating mode switching means for switching an operating mode of said correcting apparatus from an ordinary mode to an adjusting mode in response to an external command, so that said control means can actuate said adjusting circuit in said ordinary mode to control the operating parameters of said electronic circuit while said actuation data can be written into said memory means in said adjusting mode;

operating characteristic renewing means for renewing the operating parameters of said electronic circuit by actuating said adjusting circuit based on predetermined adjustment data when the operating mode of said correcting apparatus is switched to the adjusting mode by said operating mode switching means; and data storing means for storing said adjustment data, as renewed actuation data, into said memory means when said adjustment data are effectively used by said operating characteristic renewing means for actuating said adjusting circuit at a time a memory command is entered from an outside.

8. The operating characteristic correcting apparatus in accordance with claim 6, further comprising:

operating mode switching means for switching an operating mode of said correcting apparatus from an ordinary mode to an adjusting mode in response to an external command, so that said control means can actuate said adjusting circuit in said ordinary mode to control the operating parameters of said electronic circuit while said actuation data can be written into said memory means in said adjusting mode;

operating characteristic renewing means for renewing the operating parameters of said electronic circuit by actuating said adjusting circuit based on predetermined adjustment data when the operating mode of said correcting apparatus is switched to the adjusting mode by said operating mode switching means; and data storing means for storing said adjustment data as renewed actuation data, together with the detection signal sensed by said temperature sensor as related temperature data, into said memory means when said adjustment data are effectively used by said operating characteristic renewing means for actuating said adjusting circuit at a time a memory command is entered from an outside.

9. The operating characteristic correcting apparatus in accordance with claim 2, further comprising a power-on actuating circuit for forcibly closing a designated one of said adjusting switches during a power-on operation of said electronic circuit.

10. The operating characteristic correcting apparatus in accordance with claim 9, wherein said designated adjusting switch is closed until the power voltage reaches a value required for said control means to start its operation.

11. The operating characteristic correcting apparatus in accordance with claim 10, further comprising another actuation circuit provided separately from said power-on actuating circuit, for forcibly opening the adjusting switches other than said designated adjusting switch during said power-on operation of said electronic circuit.

12. The operating characteristic correcting apparatus in accordance with claim 2, wherein an overlap period is provided for ON durations of two adjusting switches to be switched in a switching operation, so that all of said adjusting switches are not opened simultaneously.

13. The operating characteristic correcting apparatus in accordance with claim 1, further comprising:

operating mode switching means for switching an operating mode of said correcting apparatus from an ordinary mode to an adjusting mode in response to an external command, said ordinary mode allowing said control means to actuate said adjusting circuit to control the operating parameters of said electronic circuit; and said memory means stores said digital actuation data in response to the switching means switching from said ordinary mode to said adjusting mode.

14. The operating characteristic correcting apparatus in accordance with claim 1, further comprising a temperature sensor provided in said integrated circuit for detecting a temperature of said electronic circuit, thereby producing a detected temperature;

wherein said actuation data are corrected based on the detected temperature and said adjusting circuit is actuated based on the corrected actuated data, so as to eliminate undesirable temperature drift in the operating parameters of said electronic circuit.

* * * * *

UNITED STATES PATENT AND TRADEMARK OFFICE
CERTIFICATE OF CORRECTION

PATENT NO.   : 6,131,073
DATED        : October 10, 2000
INVENTOR(S)  : Honda et al.

It is certified that error appears in the above-identified patent and that said Letters Patent is hereby corrected as shown below:

<u>Title page,</u>
Item [73], change "[73] Assignee: DENSO Corporation, Kawasaki, Japan" to
-- [73] Assignee: DENSO Corporation, Kariya, Japan --

Signed and Sealed this

Twelfth Day of November, 2002

Attest:

JAMES E. ROGAN
Attesting Officer    Director of the United States Patent and Trademark Office